(12) United States Patent
Shiraishi et al.

(10) Patent No.: US 9,618,854 B2
(45) Date of Patent: Apr. 11, 2017

(54) EXPOSURE METHOD, EXPOSURE APPARATUS, AND DEVICE MANUFACTURING METHOD

(71) Applicant: NIKON CORPORATION, Tokyo (JP)

(72) Inventors: Kenichi Shiraishi, Saitama (JP); Ryuichi Hoshika, Sagamihara (JP); Tomoharu Fujiwara, Ageo (JP)

(73) Assignee: NIKON CORPORATION, Tokyo (JP)

(*) Notice: Subject to any disclaimer, the term of this patent is extended or adjusted under 35 U.S.C. 154(b) by 0 days.

(21) Appl. No.: 15/145,561

(22) Filed: May 3, 2016

(65) Prior Publication Data
US 2016/0246184 A1 Aug. 25, 2016

Related U.S. Application Data

(63) Continuation of application No. 13/317,169, filed on Oct. 12, 2011, now Pat. No. 9,335,639, which is a
(Continued)

(30) Foreign Application Priority Data

Apr. 25, 2005 (JP) ................... 2005-127025
Aug. 19, 2005 (JP) ................... 2005-283373

(51) Int. Cl.
*G03B 27/42* (2006.01)
*G03F 7/20* (2006.01)

(52) U.S. Cl.
CPC ........ *G03F 7/70608* (2013.01); *G03F 7/2041* (2013.01); *G03F 7/70341* (2013.01); *G03F 7/70858* (2013.01)

(58) Field of Classification Search
CPC ............. G03F 7/70716; G03F 7/70341; G03F 7/70958
(Continued)

(56) References Cited

U.S. PATENT DOCUMENTS 4,346,164 A 8/1982 Tabarelli et al.
4,465,368 A 8/1984 Matsuura et al.
(Continued)

FOREIGN PATENT DOCUMENTS

DE 221 563 A1 4/1985
DE 224 448 A1 7/1985
(Continued)

OTHER PUBLICATIONS

Mar. 2, 2015 Office Action issued in Japanese Patent Application No. 2013-257558.
(Continued)

*Primary Examiner* — Peter B Kim
(74) *Attorney, Agent, or Firm* — Oliff PLC

(57) ABSTRACT

A liquid immersion device that has an mixing mechanism that mixes and dissolves a predetermined substance for adjusting specific resistance of the liquid, which is supplied onto a liquid repellent film on the surface of an object (member) of a projection optical system placed on the light emitting side of projection optical system, and an liquid immersion area is formed by supplying the liquid in which the predetermined liquid is dissolved onto the liquid repellent film.

20 Claims, 6 Drawing Sheets

Related U.S. Application Data continuation of application No. 11/640,842, filed on Dec. 19, 2006, now Pat. No. 8,064,039, which is a continuation of application No. PCT/JP2006/308385, filed on Apr. 21, 2006.

(60) Provisional application No. 60/751,208, filed on Dec. 19, 2005.

(58) Field of Classification Search
USPC .......................................................... 355/53
See application file for complete search history.

(56) References Cited

U.S. PATENT DOCUMENTS

| | | | |
|---|---|---|---|
| 4,480,910 A | 11/1984 | Takanashi et al. | |
| 5,175,124 A | 12/1992 | Winebarger | |
| 5,243,195 A | 9/1993 | Nishi | |
| 5,448,332 A | 9/1995 | Sakakibara et al. | |
| 5,480,563 A | 1/1996 | Mitsumori et al. | |
| 5,493,403 A | 2/1996 | Nishi | |
| 5,610,683 A | 3/1997 | Takahashi | |
| 5,646,413 A | 7/1997 | Nishi | |
| 5,715,039 A | 2/1998 | Fukuda et al. | |
| 5,721,608 A | 2/1998 | Taniguchi | |
| 5,825,043 A | 10/1998 | Suwa | |
| 5,969,441 A | 10/1999 | Loopstra et al. | |
| 6,274,040 B1 | 8/2001 | Mitsumori et al. | |
| 6,341,007 B1 | 1/2002 | Nishi et al. | |
| 6,778,257 B2 | 8/2004 | Bleeker et al. | |
| 6,828,542 B2 * | 12/2004 | Ye | G03F 7/70591 250/208.1 |
| 6,897,963 B1 | 5/2005 | Taniguchi et al. | |
| 7,199,858 B2 | 4/2007 | Lof et al. | |
| 7,301,607 B2 | 11/2007 | Hazelton et al. | |
| 7,623,218 B2 | 11/2009 | Wegmann et al. | |
| 8,064,039 B2 * | 11/2011 | Shiraishi | G03F 7/70341 355/53 |
| 2002/0041377 A1 | 4/2002 | Hagiwara et al. | |
| 2002/0163629 A1 | 11/2002 | Switkes et al. | |
| 2004/0160582 A1 | 8/2004 | Lof et al. | |
| 2004/0165159 A1 | 8/2004 | Lof et al. | |
| 2005/0007569 A1 | 1/2005 | Streefkerk et al. | |
| 2005/0024609 A1 | 2/2005 | De Smit et al. | |
| 2005/0046934 A1 | 3/2005 | Ho et al. | |
| 2005/0048220 A1 | 3/2005 | Mertens et al. | |
| 2005/0052632 A1 | 3/2005 | Miyajima | |
| 2005/0074704 A1 | 4/2005 | Endo et al. | |
| 2005/0200815 A1 | 9/2005 | Akamatsu | |
| 2005/0218856 A1 | 10/2005 | Okano | |
| 2005/0225734 A1 | 10/2005 | De Smit et al. | |
| 2005/0248856 A1 | 11/2005 | Omura et al. | |
| 2005/0255413 A1 | 11/2005 | Endo et al. | |
| 2006/0008748 A1 | 1/2006 | Inabe et al. | |
| 2006/0023189 A1 | 2/2006 | Lof et al. | |
| 2006/0050257 A1 | 3/2006 | Honda | |
| 2006/0097201 A1 | 5/2006 | Neerhof et al. | |
| 2006/0132733 A1 | 6/2006 | Modderman | |
| 2006/0139614 A1 | 6/2006 | Owa et al. | |
| 2006/0152696 A1 | 7/2006 | Boogaard et al. | |
| 2006/0164617 A1 | 7/2006 | Nagahashi | |
| 2006/0198897 A1 | 9/2006 | Pacetti et al. | |
| 2006/0222575 A1 | 10/2006 | Chen | |
| 2007/0009841 A1 | 1/2007 | Endo et al. | |
| 2007/0029198 A1 | 2/2007 | Kooi | |
| 2007/0042297 A1 | 2/2007 | Shiobara et al. | |
| 2007/0085034 A1 | 4/2007 | Chang et al. | |
| 2008/0030694 A1 | 2/2008 | Nagahashi | |
| 2008/0252876 A1 | 10/2008 | Mengel et al. | |
| 2009/0134488 A1 | 5/2009 | Jansen et al. | |
| 2009/0190113 A1 | 7/2009 | Nagahashi | |

FOREIGN PATENT DOCUMENTS

| | | |
|---|---|---|
| EP | 1 079 223 A1 | 2/2001 |
| EP | 1 522 894 A2 | 4/2005 |
| EP | 1 598 855 A1 | 11/2005 |
| EP | 1670040 A1 | 6/2006 |
| JP | S58-202448 A | 11/1983 |
| JP | S59-19912 A | 2/1984 |
| JP | S62-65326 A | 3/1987 |
| JP | S63-157419 A | 6/1988 |
| JP | H04-305915 A | 10/1992 |
| JP | H04-305917 A | 10/1992 |
| JP | H05-62877 A | 3/1993 |
| JP | H06-124873 A | 5/1994 |
| JP | H07-220990 A | 8/1995 |
| JP | H08-316125 A | 11/1996 |
| JP | H10-303114 A | 11/1998 |
| JP | H10-340846 A | 12/1998 |
| JP | H11-176727 A | 7/1999 |
| JP | 2000-058436 A | 2/2000 |
| JP | 2001-188356 A | 7/2001 |
| JP | 2004-111473 A | 4/2004 |
| JP | 2004-343114 A | 12/2004 |
| JP | 2005-005713 A | 1/2005 |
| JP | 2005-057278 A | 3/2005 |
| JP | 2005-086030 A | 3/2005 |
| JP | 2005-183693 A | 7/2005 |
| JP | 2005327976 A | 11/2005 |
| JP | 2006-024819 A | 1/2006 |
| JP | 2006186111 A | 7/2006 |
| KR | 10-0143944 | 11/1994 |
| WO | 99/49504 A1 | 9/1999 |
| WO | 2004/019128 A2 | 3/2004 |
| WO | 2004/090634 A2 | 10/2004 |
| WO | 2004/112108 A1 | 12/2004 |
| WO | 2005/031824 A1 | 4/2005 |
| WO | 2005/055296 A1 | 6/2005 |
| WO | 2005/062351 A1 | 7/2005 |
| WO | 2005/122218 A1 | 12/2005 |
| WO | 2006/084641 A2 | 8/2006 |

OTHER PUBLICATIONS

Notification of Reasons for Refusal for Japanese Application No. 2007-514659; mailed Jun. 2, 2010.
European Search Report for Application No. 06732193.5; mailed Jun. 1, 2010.
Sep. 15, 2011 Office Action issued in Japanese Patent Application No. 2007-514659.
Jul. 25, 2006 International Preliminary Report on Patentability for International Application No. PCT/JP2006/308385.
Jul. 11, 2012 Office Action issued in Korean Patent Application No. 10-2007-7002004.
Feb. 20, 2013 Office Action issued in Korean Patent Application No. 10-2013-7000873.
Jun. 3, 2013 Office Action issued in Japanese Patent Application No. 2010-173281.
Jun. 10, 2013 Office Action issued in European Application No. 06 732 193.5.
Apr. 8, 2016 Notice of Allowance issued in U.S. Appl. No. 13/317,169.
Jun. 6, 2016 Office Action issued in Japanese Patent Application No. 2015-092710.
Sep. 2, 2014 Office Action issued in Japanese Application No. 2013-257558.
Oct. 23, 2014 Restriction/Election of Species Requirement issued in U.S. Appl. No. 13/317,169.
Feb. 5, 2015 Office Action issued in U.S. Appl. No. 13/317,169.
Sep. 24, 2015 Office Action issued in U.S. Appl. No. 13/317,169.
Jan. 8, 2016 Notice of Allowance issued in U.S. Appl. No. 13/317,169.

* cited by examiner

ID: 9,618,854 B2

EXPOSURE METHOD, EXPOSURE APPARATUS, AND DEVICE MANUFACTURING METHOD

CROSS-REFERENCE TO RELATED APPLICATIONS

This application is a Continuation of U.S. patent application Ser. No. 13/317,169, filed Oct. 12, 2011, which is a Continuation of application Ser. No. 11/640,842, now U.S. Pat. No. 8,064,039, filed Dec. 19, 2006, which in turn is a Continuation of International Application PCT/JP2006/308385, with an international filing date of Apr. 21, 2006, the disclosures of which are hereby incorporated herein by reference in their entirety. This non-provisional application also claims the benefit of Provisional Application No. 60/751,208 filed Dec. 19, 2005, the disclosure of which is hereby incorporated herein by reference in its entirety.

BACKGROUND OF THE INVENTION

Field of the Invention

The present invention relates to exposure methods, exposure apparatus, and device manufacturing methods, and more particularly to an exposure method and an exposure apparatus that are used when exposing an object via a liquid, and a device manufacturing method that uses the exposure method and the exposure apparatus in a lithographic process.

Description of the Background Art

Conventionally, in a lithographic process to produce electronic devices such as a semiconductor (integrated circuit) or a liquid crystal display device, the reduction projection exposure apparatus based on a step-and-repeat method (the so-called stepper) that transfers an image of a pattern of a mask (or a reticle) via a projection optical system onto each of a plurality of shot areas on a sensitive object such as a wafer, a glass plate or the like (hereinafter generally referred to as a "wafer"), on which a resist (sensitive agent) is coated, the projection exposure apparatus based on a step-and-scan method by (the so-called scanning stepper (also called a scanner) and the like are mainly used.

With these types of projection exposure apparatus, a higher resolving power (resolution) is required year by year due to finer patterns according to higher integration of the integrated circuits, and in recent years, as a method for substantially shortening the exposure wavelength and also increasing (widening) the depth of focus compared with the depth of focus in the air, exposure apparatus that use the liquid immersion method are beginning to gather attention. As an exposure apparatus that uses the liquid immersion method, an exposure apparatus that performs exposure in a state where the space between the lower surface of a projection optical system and the surface of a wafer is filled with liquid such as water, an organic solvent or the like is known (e.g. refer to the pamphlet of International Publication WO99/49504 description). In the exposure apparatus according to Patent Document 1, the resolution is improved by the use of the fact that the wavelength of the exposure light in the liquid becomes 1/n of the wavelength in the air (n is the refractive index of the liquid which is normally around 1.2 to 1.6), and the depth of focus is also substantially enlarged n times when comparing it with the case when the same resolution is obtained without applying the liquid immersion method to the projection optical system (supposing that such a projection optical system can be made). That is, the depth of focus can be substantially enlarged n times than in the air.

However, in the liquid immersion exposure apparatus described earlier, various measurements related to exposure are performed in a state where an liquid immersion area is formed on an object (a member) on which the exposure light is irradiated.

Further, in the liquid immersion exposure apparatus, pure water or purified water is proposed as an example of the liquid. This is because purified water can be obtained in large quantities at a semiconductor manufacturing plant or the like, and it also has an advantage of having no adverse effect on the photoresist on the wafer or to the optical lenses or the like.

However, because purified water has high specific resistance, static electricity is generated due to friction with piping, nozzles or the like, and in the case the liquid immersion area is formed on the object (the member) with the charged purified water, there is a possibility that the object (the member) or a film on the surface of the object (the member) or both may be electrically charged. In this case, the film on the surface of the object (the member) on which the liquid immersion area is formed could be deteriorated or damaged. The deterioration of the film may cause unevenness in the optical properties of the deteriorated section and the section besides the deteriorated section, and/or may be the cause of water stains (water marks), which may consequently decrease the exposure accuracy. Further, foreign substances or foreign matters may adhere on the surface of the object (the member) by the charge, and such foreign substances may contaminate the liquid (purified water), the wafer and the like, which may cause faulty exposure such as defects.

Further, in the case the liquid immersion area is formed on the object (e.g. a wafer) subject to exposure with the charged purified water, the film (a resist layer, and/or a top coat layer) on the object (the wafer) could be charged. In this case, deterioration, modification or the like may occur on the film (a resist layer, and/or a top coat layer) on the object (the wafer), which could be the cause of defects being generated.

Further, in the case the object (the wafer) subject to exposure is charged, foreign substances may be adhered on the surface of the object (the wafer), and the liquid (purified water) and the object (the wafer) subject to exposure may be contaminated, which may cause faulty exposure such as defects.

SUMMARY OF THE INVENTION

The present invention was made under such circumstances, and according to a first aspect of the present invention, there is provided an exposure method in which an object is exposed via a liquid, the method comprising: a process in which a predetermined substance that adjusts specific resistance of the liquid is dissolved in the liquid and an liquid immersion area is formed by supplying the liquid in which the predetermined substance is dissolved on a film formed on the object; and a process in which exposure is performed by irradiating an exposure light on the object via the liquid and a predetermined pattern is formed.

According to this method, by dissolving the predetermined substance and reducing the specific resistance of the liquid, the liquid immersion area can be formed on the film formed on the object with the liquid whose specific resistance is reduced. Therefore, the charge of the liquid is prevented or effectively suppressed, and generation of dielectric breakdown of the film on the object where the liquid immersion area is formed can be effectively suppressed. Accordingly, by performing the exposure in which the exposure light is irradiated on the object via the liquid of which the charge is prevented or effectively suppressed and a predetermined pattern is formed, the pattern can be formed on the object with good precision for over a long period of time.

According to a second aspect of the present invention, there is provided a first exposure apparatus that exposes an object by irradiating an exposure beam on the object via an optical member and a liquid and forms a predetermined pattern on the object, the apparatus comprising: a sensor that receives a light that has the same wavelength as the exposure beam via a liquid repellent film on the surface of a member placed on the light emitting side of the optical member and a liquid on the liquid repellent film; and a liquid immersion device that has a mixing mechanism in which a predetermined substance that adjusts specific resistance of the liquid supplied onto the liquid repellent film is mixed and dissolved in the liquid, and supplies the liquid in which the predetermined substance is dissolved onto the liquid repellent film so as to form an liquid immersion area.

According to this apparatus, the liquid immersion device has the mixing mechanism that mixes and dissolves the predetermined substance for adjusting specific resistance of the liquid, which is supplied onto the liquid repellent film on the surface of the member placed on the light emitting side of the optical member, and the liquid immersion area is formed by supplying the liquid in which the predetermined liquid is dissolved onto the liquid repellent film. Therefore, the specific resistance of the liquid can be reduced so that the charge of the liquid is prevented or effectively suppressed, and generation of dielectric breakdown of the liquid repellent film where the liquid immersion area is formed can be effectively suppressed. Accordingly, measurement with high precision can be executed by the sensor for over a long period of time, and by performing the exposure in which the exposure beam is irradiated on the object via the liquid with the measurement results being reflected, exposure with high precision can be performed for over a long period of time.

According to a third aspect of the present invention, there is provided a second exposure apparatus that exposes an object by irradiating an exposure beam on the object via a liquid and forms a predetermined pattern on the object, the apparatus comprising: an object stage on which the object is mounted; and a liquid immersion device that has a mixing mechanism in which a predetermined substance that adjusts specific resistance of the liquid supplied onto a predetermined film formed on the object mounted on the object stage is mixed and dissolved in the liquid, and supplies the liquid in which the predetermined substance is dissolved onto the film so as to form an liquid immersion area.

According to this apparatus, the liquid immersion device has a mixing mechanism that mixes and dissolves, in the liquid to be supplied onto the predetermined film formed on the object mounted on the object stage, a predetermined substance for adjusting specific resistance of the liquid, and the liquid immersion device forms the liquid immersion area on the film on the object with the liquid in which the predetermined liquid is dissolved. Therefore, with the liquid whose specific resistance has been reduced, the liquid immersion area is formed on the film formed on the object. As a consequence, the charge of the liquid is prevented or effectively suppressed, and generation of dielectric breakdown of the film member on the object where the liquid immersion area is formed can be effectively suppressed. Accordingly, by performing the exposure in which the exposure beam is irradiated on the object via the liquid whose charge is prevented or effectively suppressed so as to form a predetermined pattern, the pattern can be formed on the object with good precision.

Further, in a lithographic process, by using the exposure method of the present invention, a pattern can be formed with good accuracy on an object. Therefore, according to a fourth aspect of the present invention, it can also be said that the present invention is a device manufacturing method including a lithographic process in which a device pattern is formed on the object using the exposure method of the present invention. Further, by using one of the first and second exposure apparatus of the present invention in the lithographic process, a pattern can be formed on an object with good precision. Therefore, according to a fifth aspect of the present invention, it can also be said that the present invention is a device manufacturing method including a lithographic process in which a device pattern is formed on the object using one of the first and second exposure apparatus of the present invention.

According to a sixth aspect of the present invention, there is provided a device manufacturing method including a lithographic process in which an object is exposed via a liquid within an exposure apparatus connecting to a substrate processing unit and a device pattern is formed on the object, wherein electrical charge of the object is removed by soaking the object in a conductive liquid before the object is carried into the exposure apparatus.

According to this method, because electrical charge of the object is removed before the object is carried into the exposure apparatus, adherence of foreign substances can be suppressed, which can prevent exposure defects of the object.

BRIEF DESCRIPTION OF THE DRAWINGS

In the accompanying drawings.

DESCRIPTION OF THE EMBODIMENTS

An embodiment of the present invention is described below, referring to FIGS. 1 to 6.

Figure 1:
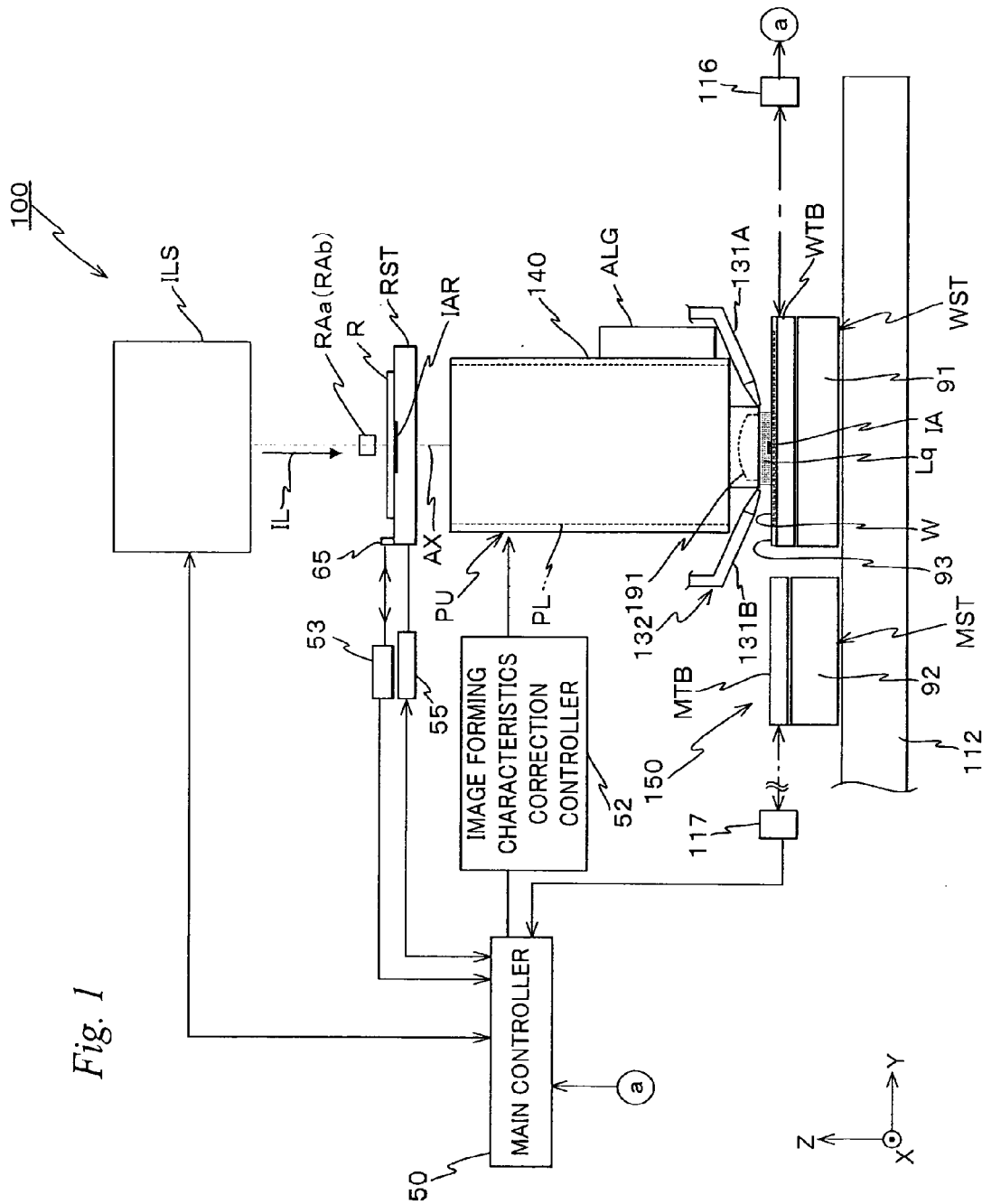
FIG. 1 is a schematic view of an arrangement of an exposure apparatus related to an embodiment.

FIG. 1 is an entire view of an arrangement of an exposure apparatus 100 related to the embodiment. Exposure apparatus 100 is a scanning exposure apparatus based on a step-and-scan method, that is, the so-called scanner.

Exposure apparatus 100 is provided with an illumination system ILS, a reticle stage RST that holds a reticle R serving as a mask illuminated by an exposure illumination light IL serving as an energy beam from illumination system ILS and moves in a predetermined scanning direction (in this case, a Y-axis direction which is the lateral direction of the page surface in FIG. 1), a projection unit PU including a projection optical system PL that projects exposure illumination light IL emitted from reticle R onto a wafer W, a stage unit 150 including a measurement stage MST used on measurement for exposure, a control system of these parts, and the like.

As the light source installed in illumination system ILS, as an example, an ArF excimer laser light source (output wavelength: 193 nm) is used, which is a pulsed light source that generates light in the vacuum ultraviolet region with the wavelength of 200 nm to 170 nm.

Further, illumination system ILS includes a beam shaping optical system, a rough energy adjuster, an optical integrator (a uniformizer, or a homogenizer), an illumination system aperture stop plate, a beam splitter, a relay lens, a reticle blind, a mirror for bending the optical path, a condenser (none of which are shown) and the like, which are placed in a predetermined positional relation. Details on the arrangement of illumination system ILS and the function of each optical member are disclosed in, for example, the pamphlet of International Publication WO2002/103766, and the like.

On reticle stage RST, reticle R on which a circuit pattern or the like is formed on the pattern surface (the lower surface in FIG. 1) is fixed, for example, by vacuum suction. Reticle stage RST can be finely driven in an XY plane by a reticle stage drive system 55 that includes, for example, a linear motor and the like, and can also be driven at a designated scanning speed in a predetermined scanning direction (in this case, the Y-axis direction, which is the lateral direction of the page surface of FIG. 1).

The position of reticle stage RST within the stage movement plane (including rotation around a Z-axis) is constantly detected by a reticle laser interferometer (hereinafter referred to as "reticle interferometer") 53 via a movable mirror 65 (a Y movable mirror that has a reflection surface orthogonal to the Y-axis direction and an X movable mirror that has a reflection surface orthogonal to an X-axis direction are actually arranged) at a resolution of, for example, around 0.5 to 1 nm. The measurement values of reticle interferometer 53 is sent to a main controller 50, and based on the measurement values of reticle interferometer 53, main controller 50 controls the position (and velocity) of reticle stage RST in the X-axis direction, the Y-axis direction, and a $\theta z$ direction (a rotation direction around the Z-axis) via stage reticle drive system 55.

Above reticle R, a pair of reticle alignment detection systems RAa and RAb are arranged in the X-axis direction at a predetermined distance, each consisting of a TTR (Through The Reticle) alignment system that uses light of the exposure wavelength to observe a pair of reticle marks on reticle R and a corresponding pair of fiducial marks (hereinafter referred to as "a first fiducial mark") on a fiducial mark plate FM (refer to FIG. 2) arranged on measurement stage MST, at the same time via projection optical system PL. As such reticle alignment detection systems RAa and RAb, a system having a structure similar to the one disclosed in, for example, Kokai (Japanese Unexamined Patent Application Publication) No. 7-176468 and the corresponding U.S. Pat. No. 5,646,413 or the like is used. As long as the national laws in designated states (or elected states), to which this international application is applied, permit, the above disclosures of the Kokai publication and the U.S. patent are incorporated herein by reference.

Projection unit PU is arranged below reticle stage RST in FIG. 1. Projection unit PU is configured including a barrel 140, and projection optical system PL consisting of a plurality of optical elements held in a predetermined positional relation within barrel 140. As projection optical system PL, a dioptric system is used, consisting of a plurality of lenses (lens elements) that share an optical axis AX in the Z-axis direction. Projection optical system PL is, for example, a both-side telecentric dioptric system and has a predetermined projection magnification (such as one-quarter, one-fifth, or one-eighth times). Therefore, when illumination light IL from an illumination optical system 12 illuminates an illumination area IAR on reticle R, a reduced image of the circuit pattern within illumination area IAR of reticle R (a partial reduced image of the circuit pattern) is formed on the wafer of which surface is coated with a resist (a sensitive agent) in an area conjugate with illumination area IAR (hereinafter also referred to as an "exposure area") by illumination light IL that has passed through reticle R, via projection optical system PL (projection unit PU). In the embodiment, an end optical element 191 that constitutes projection optical system PL closest to the image plane side (the wafer side) is a lens that has refractive power, however, end optical element 191 may also be a parallel plane plate.

Further, out of a plurality of lenses constituting projection optical system PL, a specific plurality of lenses operates under the control of an image forming characteristics correction controller 52 based on commands from main controller 50, and the optical properties (including image-forming characteristics) of projection optical system PL such as, for example, magnification, distortion, coma, curvature of image plane (including inclination of image plane) or the like, can be adjusted.

In exposure apparatus 100 of the embodiment, an exposure, to which the liquid immersion method is applied, is performed as in the description later on, and thus the numerical aperture NA substantially increases which makes the opening on the reticle side larger. Therefore, in a dioptric system consisting only of lenses, it becomes difficult to satisfy the Petzval condition, which tends to lead to an increase in the size of the projection optical system. In order to prevent such an increase in the size of the projection optical system, a catodioptric system that includes mirrors and lenses may also be used.

Further, in exposure apparatus 100 of the embodiment, in the vicinity of lens 191, which serves as an end optical element (hereinafter also referred to as a "tip lens") that constitutes projection optical system PL closest to the image plane side (the wafer W side), a liquid supply nozzle 131A and a liquid recovery nozzle 131B that constitute a part of an liquid immersion unit 132 are arranged.

Figure 6:
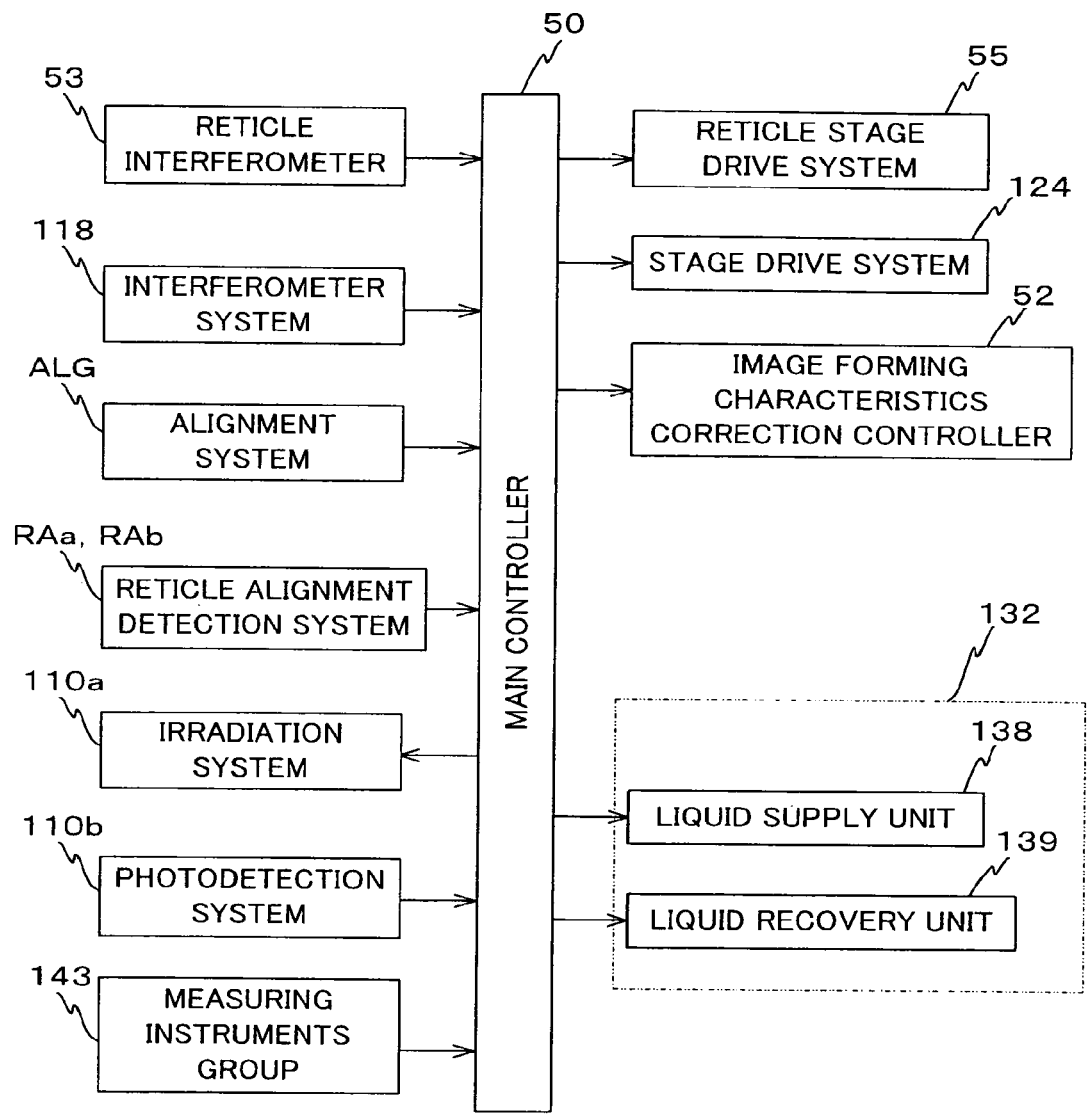
FIG. 6 is a block diagram for showing a main arrangement of a control system of an exposure apparatus related to an embodiment.

Liquid supply nozzle 131A connects to the other end of a supply pipe 78 (not shown in FIGS. 1 and 6, refer to FIG. 3) that has one end connected to a part of a liquid supply unit 138 (not shown in FIG. 1, refer to FIG. 6), and liquid recovery nozzle 131B connects to the other end of a recovery pipe (not shown) that has one end connected to a liquid recovery unit 139 (not shown in FIG. 1, refer to FIG. 6).

In the embodiment, a liquid Lq used for liquid immersion (refer to FIG. 1) is to be made using pure water or purified water that transmits the ArF excimer laser beam (light with a wavelength of 193 nm). Pure water can be obtained in large quantities at a semiconductor manufacturing plant or the like, and it also has an advantage of having no adverse effect on the photoresist on the wafer, the optical lenses or the like.

Figure 3:
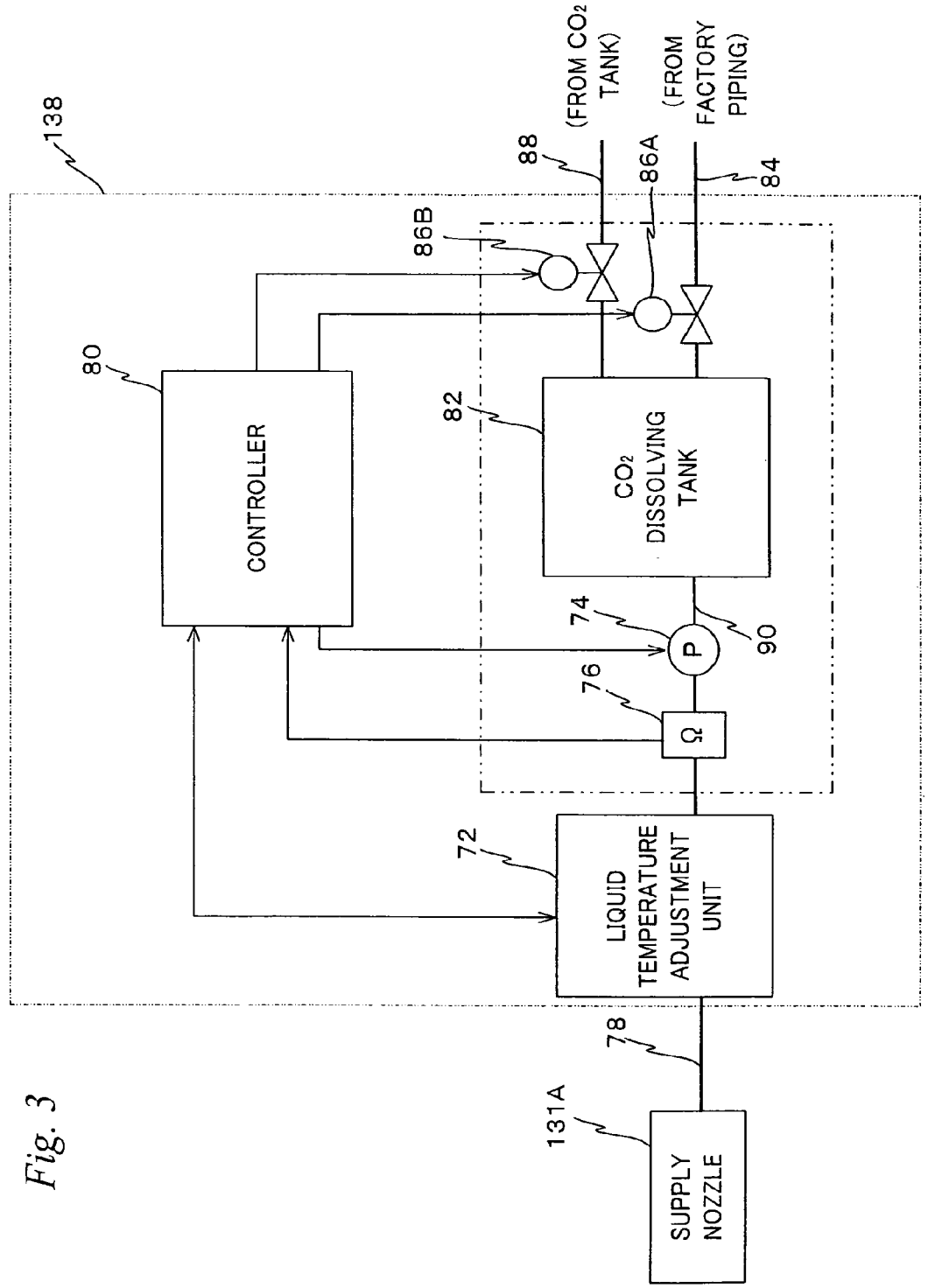
FIG. 3 is a schematic view of a liquid supply unit.

FIG. 3 shows an example of a configuration of liquid supply unit 138. As is shown in FIG. 3, liquid supply unit 138 is provided with a pure water supply pipe 84 that has one end connected to a factory piping for pure water of the semiconductor manufacturing plant and the other end connected to one end of a $CO_2$ dissolving tank 82 that also functions as tank for the liquid, a flow control electromagnetic valve 86A arranged along pure water supply pipe 84, a $CO_2$ supply pipe 88 that connects one end of $CO_2$ dissolving tank 82 described above and a $CO_2$ tank (not shown), a flow control electromagnetic valve 86B arranged along $CO_2$ supply pipe 88, a supply piping 90 that has one end connecting to the other end of $CO_2$ dissolving tank 82 (on the opposite side of pure water supply pipe 84), a liquid temperature adjustment unit 72 that has one end connected to the other end of supply piping 90 and performs temperature adjustment of the liquid, a pressurized pump 74 and a specific resistance indicator 76 arranged along supply piping 90, a supply pipe 78 that has one end connected to the other end of liquid temperature adjustment unit 72 and liquid supply nozzle 131A arranged in the other end, a controller 80 connecting to sections such as liquid temperature adjustment unit 72, flow control electromagnetic valves 86A and 86B, pressurized pump 74, specific resistance indicator 76 and the like.

Controller 80 makes pressurized pump 74 operate under instructions from main controller 50, and during the operation, controller 80 also controls flow control electromagnetic valves 86A and 86B while monitoring specific resistance values of the liquid from $CO_2$ dissolving tank 82 (pure water in which carbon dioxide is dissolved) measured by specific resistance indicator 76, so that the specific resistance values measured become values within a predetermined range. Accordingly, within $CO_2$ dissolving tank 82, carbon dioxide ($CO_2$) supplied from a $CO_2$ tank becomes mixed or incorporated into the pure water supplied via factory piping and is dissolved, and liquid Lq that has a desired specific resistance value (pure water, or to be more precise, carbonated water) is generated. More specifically, in the embodiment, carbon dioxide that reduces specific resistance is incorporated into and is dissolved in the pure water, and is supplied on measurement table MTB or on wafer table WTB as liquid Lq via liquid supply nozzle 131A. For incorporation (dissolution) of carbon dioxide (carbonic acid gas) into the pure water, various methods can be employed such as directly incorporating carbonic acid gas into the pure water, incorporating carbonic acid gas into the pure water via a hollow fiber film or the like. Or, air that contains carbonic acid gas can be dissolved into the pure water.

Then, according to instructions from controller 80, liquid temperature adjustment unit 72 adjusts the temperature of liquid Lq so that the temperature of the liquid is about the same level as the temperature within the chamber (not shown) where the main body of the exposure apparatus is housed. In this case, controller 80 controls the flow amount of liquid Lq supplied via liquid supply nozzle 131A by adjusting the degree of opening of flow control electromagnetic valves 86A and 86B in a state where the flow amount ratio of pure water and carbon dioxide is maintained. However, as a matter of course, the temperature of the liquid and the flow amount can also be adjusted by arranging a flow control valve inside or in the vicinity of liquid temperature adjustment unit 72.

Liquid recovery unit 139 includes a tank of the liquid, a suction pump, and a valve for controlling the recovery/stop of the liquid via a recovery pipe and the like. As the valve, it is desirable to use a flow control valve corresponding to the valve on liquid supply unit 138 side described earlier.

Refractive index n of the pure water to the ArF excimer laser beam is approximately 1.44. In the pure water, the wavelength of illumination light IL is 193 nm×1/n, shorted to around 134 nm. In the case of the embodiment, as liquid Lq, the water solution previously described in which carbon dioxide is dissolved is used. Therefore, in a strict sense, the refractive index differs with pure water according to the ratio of carbon dioxide that has been incorporated. However, since the incorporation ratio of carbon dioxide is small, refractive index n of liquid Lq to the ArF excimer laser beam will not be much different from the value above.

Liquid immersion unit 132 that includes liquid supply nozzle 131A and liquid recovery nozzle 131B operates under the control of main controller 50 (refer to FIG. 6). Main controller 50 supplies liquid Lq to the space in between tip lens 191 and wafer W via liquid supply nozzle 131A and also recovers liquid Lq from the space in between tip lens 191 and wafer W via liquid recovery nozzle 131B. In this case, main controller 50 performs control so that the amount of liquid Lq supplied to the space in between tip lens 191 and wafer W from liquid supply nozzle 131A is constantly equal to the amount of liquid Lq recovered from the space in between tip lens 191 and wafer W via liquid supply nozzle 131A. Accordingly, a constant amount of liquid Lq (refer to FIG. 1) is held or retained in the space between tip lens 191 and wafer W. In this case, liquid Lq held in the space between tip lens 191 and wafer W is constantly replaced.

In the case when measurement stage MST is also positioned below projection unit PU, liquid Lq can be filled in the space between measurement table MTB and tip lens 191.

In the description above, for the sake of simplicity of the description, the case has been described where the number of nozzles arranged for the liquid supply nozzle and the liquid recovery nozzle is one each. However, the arrangement is not limited to this, and as is disclosed in, for example, the pamphlet of International Publication WO99/49504, an arrangement that has many nozzles can be employed. Further, an arrangement disclosed in, for example, European Patent Application Publication No. 1,598,855 or in the pamphlet of International Publication WO2004/090634 and the like can also be employed in liquid immersion unit 132. The point is, as long as the liquid can be supplied to the space between the optical member (tip lens) at the lowest end configuring projection optical system PL and wafer W, the arrangement of liquid immersion unit 132 can be of any arrangement whatsoever.

As is shown in FIG. 1, on the +Y side of projection unit PU, an off-axis alignment system (hereinafter shortened to "alignment system") ALG that optically detects marks subject to detection such as alignment marks or the like on wafer W is arranged. As alignment system ALG, sensors of various methods can be used. However, in the embodiment, a sensor by the image-processing method is used. Details on sensors by the image-processing method are disclosed in, for example, Kokai (Japanese Patent Unexamined Application Publication) No. 4-65603, the corresponding U.S. Pat. No. 5,493,403 and the like. The imaging signals from alignment system ALG are sent to main controller 50 (refer to FIG. 6). As long as the national laws in designated states or elected states, to which this international application is applied, permit, the above disclosures of the publication and the U.S. patent are incorporated herein by reference.

Figure 2:
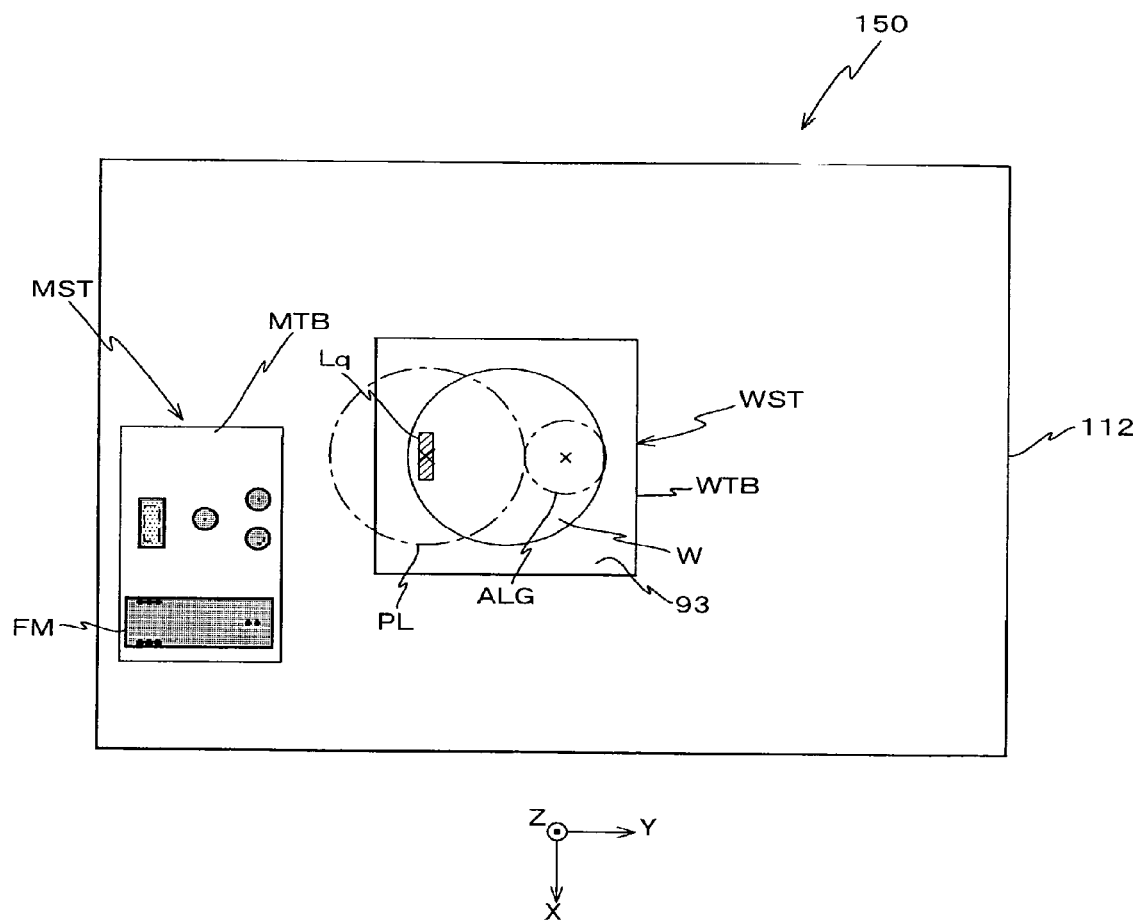
FIG. 2 is a planar view of a stage unit in FIG. 1.

As is shown in FIGS. 1 and 2, stage unit 150 is provided with a base plate 112, a wafer stage WST and measurement stage MST arranged above the upper surface of base plate 112, an interferometer system 118 (refer to FIG. 6) for measuring the position of stages WST and MST, and a stage drive system 124 (refer to FIG. 6) for driving stages WST and MST using linear motors or the like.

On the bottom surfaces of wafer stage WST and measurement stage MST, non-contact bearings (not shown) such as for example, static air bearings (that is, air bearings (also called air pads)) are arranged in a plurality of areas, and by means of the static pressure of the pressurized air blowing out from the static air bearings toward the upper surface of base plate 112, wafer stage WST and measurement stage MST are supported by levitation above the upper surface of base plate 112 via a clearance of around several μm. Further, stages WST and MST are each driven (including the θz rotation) independently within the XY plane by stage drive system 124. The position of wafer stage WST and measurement stage MST within the stage movement plane (the XY plane) and the rotation position around each coordinate axis are detected by interferometer system 118. In FIG. 1, in order to simplify the description, only a Y-axis interferometer 116 for measuring the position of wafer stage WST in the Y-axis direction and a Y-axis interferometer 117 for measuring the position of measurement stage MST in the Y-axis direction are shown. The measurement values of interferometer system 118 (116, 117) are sent to main controller 50, and main controller 50 controls the position (and velocity) of wafer stage WST and measurement stage MST via stage drive system 124 based on the measurement values of interferometer system 118.

More specifically, as is shown in FIG. 1, wafer stage WST is provided with a wafer stage main body 91 that has the air bearings described above arranged on its bottom surface, and a wafer table WTB mounted on wafer stage main body 91 via a Z-leveling mechanism (not shown)(including an actuator such as, for example, a voice coil motor) that moves finely with respect to wafer stage main body 91 in the Z-axis direction, the rotation direction around the X-axis (the θx direction), and the rotation direction around the Y-axis (the θy direction).

On wafer table WTB, a wafer holder (not shown) is arranged that holds wafer W by vacuum suction or the like. The wafer holder is provided with a plate-shaped main body section, and a plate 93 (refer to FIGS. 1 and 2) that has a circular opening formed in the center whose diameter is around 0.1 to 2 mm larger than that of wafer W, fixed to the upper surface of the main body section. On the area of the main body section within the circular opening of plate 93, many pins are arranged and wafer W is vacuum suctioned in a state where wafer W is supported by the pins. In this case, in the state where wafer W is vacuum suctioned, the surface of wafer W and the surface of plate 93 are substantially flush with each other. On the entire surface of plate 93, a liquid repellent material (water repellent material) such as a fluorinated resin material, an acrylic resin material or the like is coated and a liquid repellent film is formed. Further, on the surface of wafer W, a resist (a sensitive material) is coated, and by the coated resist a resist film is formed. In this case, as the resist film, it is desirable to use a film that is liquid repellent to liquid Lq used for liquid immersion. Further, on the surface of wafer W, a top coat film (layer) can also be formed covering the resist film. As the top coat film, it is desirable to use a film that is liquid repellent to liquid Lq used for liquid immersion. The top coat film has at least one of the following functions: a protective function of protecting the resist film from liquid Lq, an elution prevention function of preventing materials that constitute the resist film from eluting into liquid Lq, and a reflection prevention function of preventing the reflection of illumination light IL.

As is shown in FIG. 1, measurement stage MST is provided with a measurement stage main body 92 that has the air bearings described above arranged on its bottom surface, and a measurement table MTB mounted on measurement stage main body 92 via Z-leveling mechanism (not shown).

Measurement table MTB includes a hollow rectangular-parallelepiped housing 120 (refer to FIG. 5) that has an opening on the upper surface and a plate member 101 of a predetermined thickness formed by a liquid repellent material such as polytetrafluoroethylene (Teflon (brand name)) that closes or covers the upper surface of housing 120, and has a rectangular-parallelepiped appearance whose size in the height direction is much more smaller than the size in the width direction and the size in the depth direction.

Figure 4:
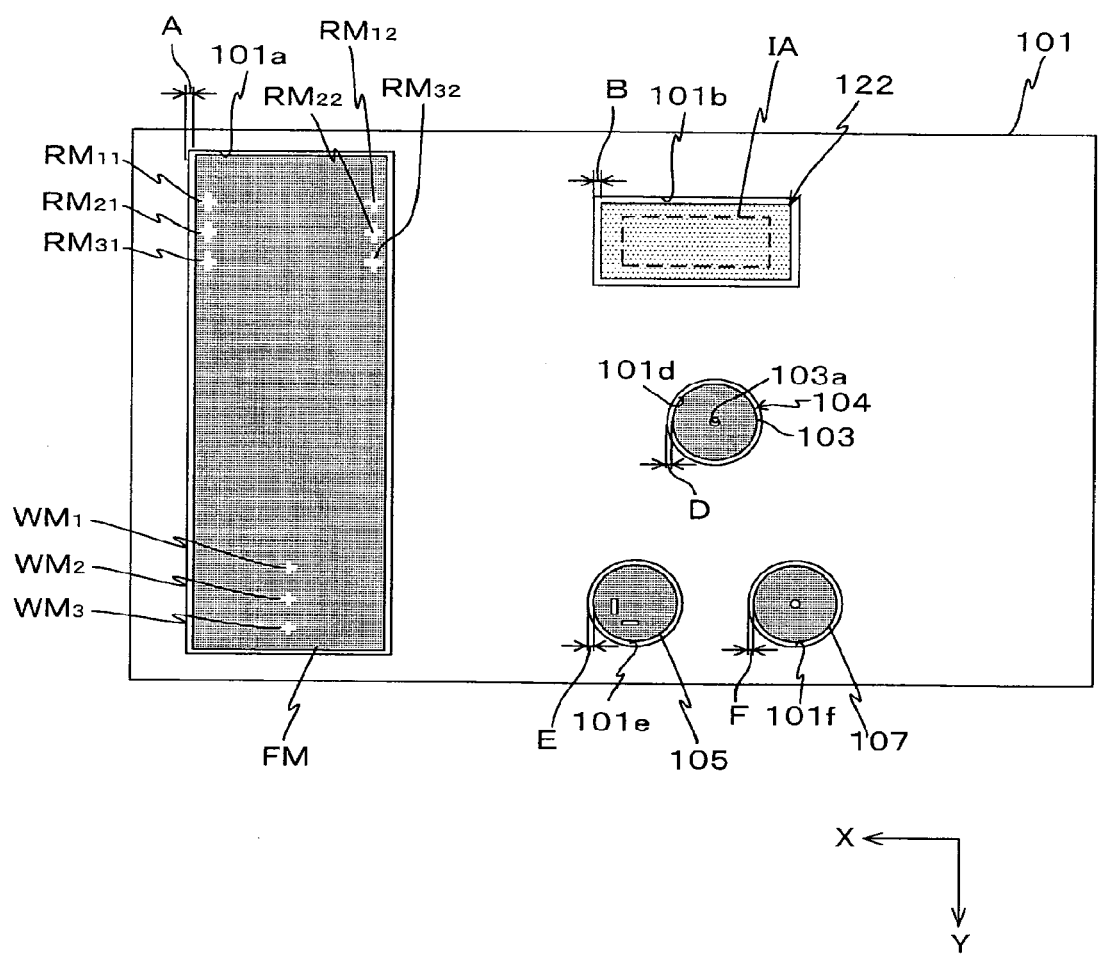
FIG. 4 is a planar view of a measurement table.

In plate member 101, as is shown in FIG. 4, which is a planar view of measurement table MTB, a rectangular opening 101a whose longitudinal direction is in the Y-axis direction, a rectangular opening 101b whose size in the X-axis direction serving as the longitudinal direction is substantially the same as opening 101a, and three circular openings 101d, 101e, and 101f are formed.

Figure 5:
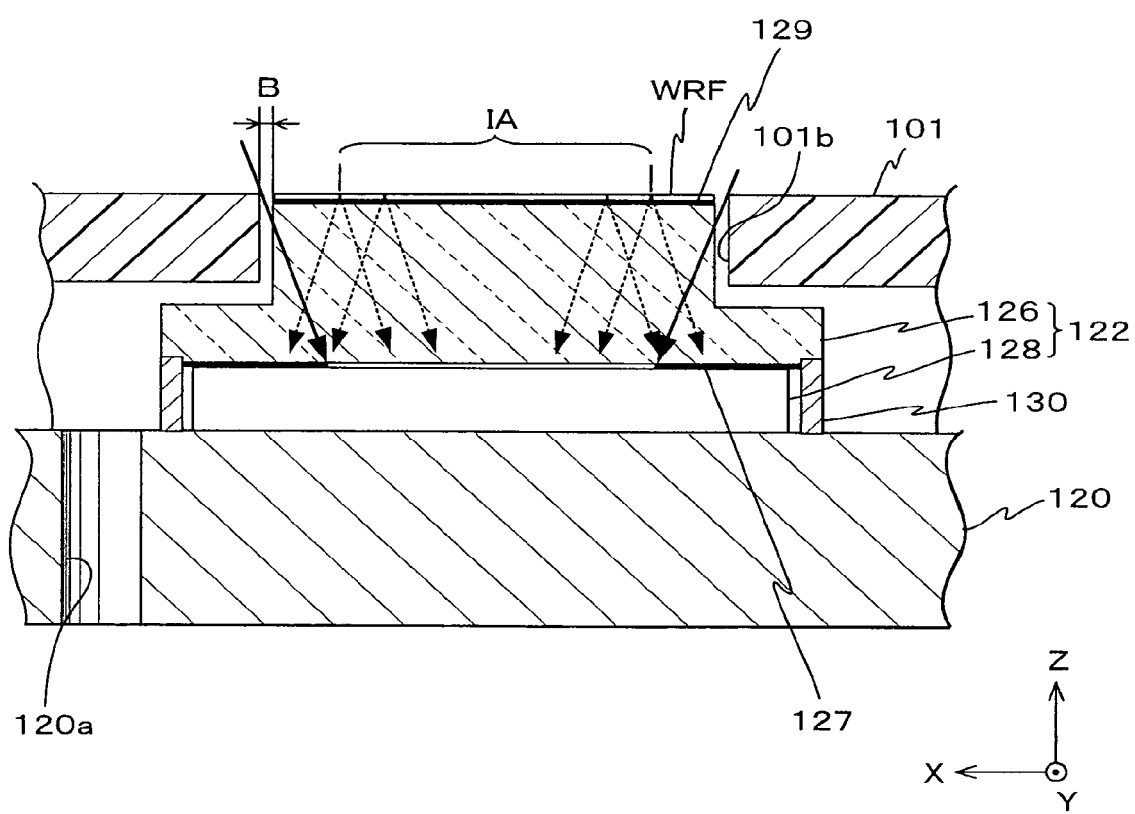
FIG. 5 is a longitudinal sectional view of a measurement table showing the vicinity of an illuminance monitor 122.

On the inner side of opening 101b of plate member 101 and underneath opening 101b inside housing 120, an illuminance monitor (irradiation amount monitor) 122 is placed, as is shown in FIG. 5. Illuminance monitor 122, as is shown in FIG. 5, is provided with a glass member 126 made of glass, from materials such as synthetic silica glass or calcium fluoride, an optical sensor 128, which is fixed on the lower surface of glass member 126 without hardly any gap and the like. Optical sensor 128 has a photodetection surface of a predetermined area that can receive almost all of illumination light IL irradiated on exposure area IA (refer to FIG. 4) described earlier shown in FIG. 5, and includes a group of photoelectric elements such as a plurality of silicon photodiodes (or photo multiplier tubes) that are sensitive to light in the same wavelength region as illumination light IL (e.g. wavelength of around 300 nm to 100 nm) and also have a high response frequency for detecting illumination light IL.

As is shown in FIG. 5, glass member 126 has a shape that faces the inner surface side and the lower surface side of opening 101b of plate member 101 via a predetermined gap. In this case, the size of the width of a gap B between opening 101b and the upper side surface of glass member 126 is set, for example, at around 0.3 mm.

Glass member 126 engages from above with a support member 130 arranged on the upper surface of the bottom wall of housing 120. More specifically, support member 130 has a frame shape with a predetermined width that encloses optical sensor 128 in a planar view (when viewed from above), and on the lower surface in the outer periphery section of glass member 126, a step section that engages with the upper end section of support member 130 is formed. On glass member 126, a light attenuating film 129 made of a metal film such as chromium that reduces or attenuates illumination light IL is formed on the entire upper surface, and further on the light attenuating film, a liquid repellent material (water repellent material) such as a fluorinated resin material, an acrylic resin material or the like is coated and a liquid repellent film WRF is formed. In the embodiment, the upper surface of liquid repellent film WRF and the upper surface of plate member 101 are set substantially on the same surface (flush with each other).

Meanwhile, on the lower surface of glass member 126, a light shielding film 127 is formed, made of a metal film such as chromium that covers the area excluding a rectangular area in the center. Light shielding film 127 cuts the stray light (refer to the thick solid line arrows in FIG. 5) that enters glass member 126 via gap B as is shown in FIG. 5.

Illuminance monitor 122 of the embodiment has a configuration similar to the illuminance monitor (illumination amount monitor) whose details are disclosed in, for example, Kokai (Japanese Patent Unexamined Application Publication) No. 6-291016, the corresponding U.S. Pat. No. 5,721,608 and the like, and measures the illuminance of illumination light IL via liquid Lq on the image plane of projection optical system PL. Detection signals (photoelectric conversion signals) of optical sensor 128 that constitutes a part of illuminance monitor 122 are supplied to main controller 50 via a hold circuit (not shown)(e.g. a peak hold circuit) and an analog/digital (A/D) converter (not shown). As long as the national laws in designated states or elected states, to which this international application is applied, permit, the above disclosures of the publication and the U.S. patent are incorporated herein by reference.

The side surface of glass member 126 at least in the area that faces plate member 101 and the inner wall surface of opening 101b in plate member 101 that faces glass member 126 are liquid repellent, due to a liquid repellent treatment applied. The liquid repellent treatment can be performed by coating the liquid repellent material such as the fluorinated resin material, the acrylic resin material or the like, previously described.

Further, on the bottom wall of housing 120 in the vicinity of support member 130, an discharging hole 120a is formed. Discharging hole 120a connects to a recovery section (not shown) via a piping (not shown). The recovery section is provided with a vacuum system, a vapor-liquid separator that includes a tank that can hold liquid Lq and the like. The recovery section recovers liquid Lq that has entered within housing 120 via gap B regardless of the liquid repellent treatment.

Inside opening 101a of plate member 101, fiducial mark plate FM that has a rectangular shape in a planar view is placed as is shown in FIG. 4. In this case, between fiducial mark plate FM and plate member 101, a gap A of around 0.3 mm for example is formed surrounding fiducial mark plate FM. The upper surface of fiducial mark plate FM is set at substantially the same height as (flush with) the surface of plate member 101. On the surface of fiducial mark plate FM, three pairs of first fiducial marks $RM_{11}$ to $RM_{32}$ that can be simultaneously measured pair by pair by the pair of reticle alignment detection systems RAa and RAb previously described and three second fiducial marks $WM_1$ to $WM_3$ detected by alignment system ALG are formed in a predetermined positional relationship. Each of these fiducial marks are formed of aperture patterns made by patterning on a chromic layer formed covering almost all of the surface of a member configuring fiducial mark plate FM (e.g. ultra low-thermal expansion glass-ceramic, for example, such as ClearCeram (brand name)) at the predetermined positional relationship referred to above. Each fiducial mark can also be formed of patterns (residual patterns) of aluminum or the like.

In the embodiment, as is disclosed in, for example, Kokai (Japanese Patent Unexamined Application Publication) No. 5-21314, the corresponding U.S. Pat. No. 5,243,195 and the like, the first fiducial mark $RM_{j1}$, $RM_{j2}$ (j=1 to 3) described above can be measured simultaneously by the pair of reticle alignment detection systems RAa and RAb via liquid Lq, and the arrangement of each of the fiducial marks above is also determined so that the second fiducial mark $WM_j$ can be measured simultaneously with the measurement of the first fiducial mark $RM_{j1}$, $RM_{j2}$ without going through liquid Lq. As long as the national laws in designated states or elected states, to which this international application is applied, permit, the above disclosures of the publication and the U.S. patent are incorporated herein by reference. Further, the upper surface of fiducial mark plate FM is substantially flat, and can be used as a reference surface of a multiple point focal position detection system. On the upper surface of fiducial mark plate FM, although it is not shown, a liquid repellent film made of the liquid repellent material such as the fluorinated resin material, the acrylic resin material or the like, previously described is formed on the upper section of the chromic layer described above.

To the side surface of fiducial mark plate FM in at least the area that faces plate member 101 and the inner wall surface of opening 101a in plate member 101 that faces fiducial mark plate FM, liquid repellent treatment is applied in a similar manner as is previously described. Further, on the bottom wall of housing 120 also in the vicinity of fiducial mark plate FM, a discharging hole similar to discharging hole 120a is formed, and this discharging hole connects to the vacuum system of the recovery section previously described.

On the inner side of opening 101d of plate member 101 and below opening 101b inside housing 120, an uneven illuminance measuring instrument 104 that has a pattern plate 103 of a circular shape when viewed from above is placed. Between pattern plate 103 and plate member 101, a gap D that has a width size of around 0.3 mm, for example, is formed surrounding pattern plate 103.

Uneven illuminance measuring instrument 104 has pattern plate 103 referred to above and a sensor (not shown) consisting of a photoelectric element (such as a silicon photodiode or a photo multiplier tube referred to earlier) placed below the pattern plate. Pattern plate 103 is made of glass from materials such as synthetic silica glass as in glass member 126 described earlier, and on its surface a light shielding film such as chromium is formed that has a pinhole 103a serving as a light transmitting section formed in the center. And, on the shielding film, the liquid repellent film made of the liquid repellent material such as the fluorinated resin material, the acrylic resin material or the like previously described is formed.

Uneven illuminance measuring instrument 104 referred to above has a configuration similar to the uneven illuminance measuring instrument whose details are disclosed in, for example, Kokai (Japanese Unexamined Patent Application Publication) No. 57-117238 and the corresponding U.S. Pat. No. 4,465,368 and the like, and measures the uneven illumination of illumination light IL via liquid Lq on the image plane of projection optical system PL. Then, detection signals (photoelectric conversion signals) of the sensor configuring the uneven illuminance measuring instrument are supplied to main controller 50 via a hold circuit (not shown)(e.g. a peak hold circuit) and an analog/digital (A/D) converter (not shown). As long as the national laws in designated states or elected states, to which this international application is applied, permit, the above disclosures of the publication and the U.S. patent are incorporated herein by reference.

Inside opening 101e of plate member 101, a slit plate 105 that has a circular shape in a planar view is placed in a state where the surface of slit plate 105 is substantially on the same surface as (flush with) the surface of plate member 101. Between slit plate 105 and plate member 101, a gap E that has a width size of around 0.3 mm, for example, is formed surrounding slit plate 105. Similar to pattern plate 103, slit plate 105 is made of synthetic silica glass and has a light shielding film made of chromium or the like formed on the surface of the synthetic silica glass, and has slit patterns serving as a light transmitting section, extending in the X-axis direction and Y-axis direction at predetermined places on the light shielding film. And, on the light shielding film, the liquid repellent film made of the liquid repellent material such as the fluorinated resin material, the acrylic resin material or the like previously described is formed. Slit plate 105 configures a part of an aerial image measuring instrument that measures the light intensity of an aerial image of a pattern projected by projection optical system PL. In the embodiment, inside measurement table MTB (housing 120) underneath slit plate 105, a photodetection system is arranged that receives illumination light IL via the slit pattern, irradiated on plate member 101 via projection optical system PL and liquid Lq, which constitutes an aerial image measuring instrument similar to the one disclosed in, for example, Kokai (Japanese Unexamined Patent Application Publication) No. 2002-14005 and the corresponding U.S. Patent Application Publication No. 2002/0041377. As long as the national laws in designated states or elected states, to which this international application is applied, permit, the above disclosures of the Kokai publication and the U.S. patent application publication are incorporated herein by reference.

Inside opening 101*f* of plate member 101, a wavefront aberration measurement pattern plate 107 that has a circular shape in a planar view is placed in a state where the surface of wavefront aberration measurement pattern plate 107 is substantially on the same surface as (flush with) the surface of plate member 101. Similar to pattern plate 103, wavefront aberration measurement pattern plate 107 is made of synthetic silica glass and has a light shielding film made of chromium or the like formed on the surface of the synthetic silica glass, and has a circular opening formed in the center of the light shielding film. And, on the light shielding film, the liquid repellent film made of the liquid repellent material such as the fluorinated resin material, the acrylic resin material or the like previously described is formed. Inside measurement table MTB (housing 120) underneath wavefront aberration measurement pattern plate 107, for example, a photodetection system that includes a microlens array that receives illumination light IL via projection optical system PL and liquid Lq is arranged, which constitutes a wavefront aberration measuring instrument. The details of the instrument are disclosed in, for example, the pamphlet of International Publication WO99/60361, and the corresponding European Patent Publication No. 1,079,223 Description. As long as the national laws in designated states or elected states, to which this international application is applied, permit, the above disclosures of the pamphlet of International Publication and the European Patent Publication are incorporated herein by reference.

The liquid repellent treatment similar to the one previously described is applied to each of the following areas: the areas on the side surfaces of pattern plate 103, slit plate 105, and wavefront aberration measurement pattern plate 107 that face at least plate member 101, the inner wall surface of opening 101*d* of plate member 101 that faces pattern plate 103, the inner wall surface of opening 101*e* of plate member 101 that faces slit plate 105, and the inner wall surface of opening 101*f* of plate member 101 that faces wavefront aberration measurement pattern plate 107. Further, on the bottom wall of housing 120, an discharging hole similar to discharging hole 120*a* described earlier is formed each in the vicinity of pattern plate 103, in the vicinity of slit plate 105, and in the vicinity of wavefront aberration measurement pattern plate 107, and these discharging holes connect to the vacuum system of the recovery section previously described.

Although it is omitted in the drawings, in the embodiment, inside housing 120, because photodetection elements (sensors) are arranged that configure the various measuring instruments described earlier, in order to prevent the influence of heat generation of the photodetection elements as much as possible, a cooling mechanism for cooling the photodetection elements and housing 120 is arranged. As the cooling mechanism of the photodetection elements, a combination of a heat sink arranged on the bottom wall of housing 120 and a Peltier element connected to the heat sink can be given. Further, as the cooling mechanism for housing 120, for example, a mechanism by the liquid cooling method that circulates a cooling liquid inside the piping can be employed.

From the viewpoint of suppressing the influence of heat, for example, in the aerial image measuring instrument or in the wavefront aberration measuring instrument, the part of the instrument installed in measurement stage MST can be limited to the optical system or the like.

Further, in exposure apparatus 100 of the embodiment, although it is not shown in FIG. 1, a multiple point focal position detection system by an oblique incident method similar to the one disclosed in, for example, Kokai (Japanese Patent Unexamined Application Publication) No. 6-283403 (the corresponding U.S. Pat. No. 5,448,332) or the like that includes an irradiation system 110*a* and a photodetection system 110*b* (refer to FIG. 6) is arranged.

FIG. 6 shows a main configuration of a control system of exposure apparatus 100. The control system is mainly composed of main controller 50, which is constituted by a microcomputer (or a workstation) and has controls the overall operation of the entire apparatus. In FIG. 6, reference numeral 143 indicates a group of measuring instruments such as illuminance monitor 122, uneven illuminance measuring instrument 104, the aerial image measuring instrument, the wavefront aberration measuring instrument and the like arranged on measurement table MTB.

Next, a parallel processing operation using both wafer stage WST and measurement stage MST in exposure apparatus 100 of the embodiment will be described, referring to FIG. 2 or the like. During the following operation, main controller 50 controls liquid immersion unit 132 and constantly fills in the space below tip lens 191 of projection optical system PL with liquid Lq.

FIG. 2 shows a state where exposure of wafer W (in this case, as an example, the wafer is to be the last wafer of a specific lot (one lot has 25 to 50 wafers)) on wafer stage WST is performed by a step-and-scan method. At this point, measurement stage MST is waiting at a predetermined waiting position where it does not bump into or collide with wafer stage WST.

The above-mentioned exposure operation is performed by repeating a movement operation in between shots where wafer stage WST is moved to a scanning starting position (acceleration starting position) for exposure of each of the shot areas on wafer W and a scanning exposure operation where the pattern formed on reticle R is transferred onto each shot area by the scanning exposure method, based on results of wafer alignment such as, for example, Enhanced Global Alignment (EGA) that has been performed in advance. The exposure operation above is performed in a state where liquid Lq is held in the space between tip lens 191 and wafer W.

Then, on the wafer stage WST side, at the point where exposure of wafer W has been completed, main controller 50 moves measurement stage MST (measurement table MTB) until it comes to a position close to the −Y side of wafer stage WST located at an exposure end position, by controlling stage drive system 124 based on the measurement values of interferometer system 118. At this point, main controller 50 monitors the measurement values of interferometer system 118, of the interferometer that measures the position of each table in the Y-axis direction so that a non-contact state is maintained between measurement table MTB and wafer table WTB, distanced apart in the Y-axis direction by, for example, around 300 The arrangement, however, is not limited to this, and main controller 50 can make the −Y side surface of measurement table MTB come into contact with the +Y side surface of wafer table WTB.

Next, main controller 50 begins the operation of simultaneously driving wafer stage WST and measurement stage MST in the +Y direction while maintaining the positional relation of wafer table WTB and measurement table MTB in the Y-axis direction.

When wafer stage WST and measurement stage MST are simultaneously moved by main controller 50 in the manner described above, liquid Lq that has been held in the space between tip lens 191 of projection unit PU and wafer W sequentially moves over the following areas along with the movement of wafer stage WST and measurement stage MST to the +Y side; wafer W→plate 93→measurement table MTB. That is, liquid Lq is in a state where it is held in the space between measurement table MTB and tip lens 191.

Next, main controller 50 controls the position of wafer stage WST by controlling stage drive system 124 based on the measurement values of interferometer system 118 so that wafer stage WST is moved to a predetermined wafer exchange position and also exchanges the wafer to the first wafer of the following lot, and in parallel with the operation, main controller 50 also performs a predetermined measurement using measurement stage MST when necessary.

As an example of the predetermined measurement, for example, baseline measurement of alignment system ALG can be given.

More specifically, main controller 50 detects the first fiducial mark in pairs on fiducial mark plate FM arranged on measurement stage MST and the corresponding reticle alignment marks on reticle R at the same time using reticle alignment systems RAa and RAb previously described, and detects the positional relation between the first fiducial mark in pairs and the corresponding reticle alignment marks. At this point, the first fiducial mark is detected via projection optical system PL and liquid Lq. Further, at the same time, by also detecting second fiducial marks on fiducial mark plate FM with the alignment system ALG, main controller 50 detects the positional relation between the detection center of alignment system ALG and the second fiducial mark.

Then, based on the positional relation between the first fiducial mark in pairs and the corresponding reticle alignment marks and the positional relation between the detection center of alignment system ALG and the second fiducial marks obtained above, and the known positional relation between the first fiducial mark in pairs and the second fiducial marks, main controller 50 obtains the distance (or the positional relation) between the projection center of the reticle pattern by projection optical system PL and the detection center of alignment system ALG, that is, obtains the baseline of alignment system ALG.

Then, at the stage where the operations on both stages WST and MST have been completed, main controller 50 sets measurement stage MST and wafer stage WST to the neighboring state that has been described earlier and simultaneously moves both stage WST and MST in the −Y direction, reversing the operation above while maintaining the positional relation of wafer stage WST and measurement stage MST in the Y-axis direction and holding liquid Lq under projection optical system PL so as to move wafer stage WST (the wafer) to the position under projection optical system PL, and then makes measurement stage MST withdraw to a predetermined position.

Then, main controller 50 executes wafer alignment and the exposure operation by the step-and-scan method of a new wafer, and sequentially transfers the reticle pattern onto the plurality of shot areas on the wafer. Hereinafter, main controller 50 repetitively performs the same operation.

In the description above, the case has been described where baseline measurement is performed as the measurement operation, however, the present invention is not limited to this, and at least one of illuminance measurement, uneven illuminance measurement, aerial image measurement, wavefront aberration measurement can be performed using the measuring instrument group of measurement stage MST while wafer exchange of each wafer is performed on the wafer stage WST side, and the measurement results can be reflected in the exposure of the wafers that will be performed later on. To be more specific, for example, image forming characteristics correction controller 52 can perform adjustment of projection optical system PL based on the measurement results. Further, the apparatus does not necessarily have to be provided with all of the group of measuring instruments such as the illuminance monitor, the uneven illuminance measuring instrument, the aerial image measuring instrument, the wavefront aberration measuring instrument and the like arranged on measurement table MTB, and only a part of the instruments may be installed in measurement stage MST as necessary.

Further, while the series of operations above are being performed, main controller 50 continues to fill in the space of the optical path on the image plane side of projection optical system PL by controlling liquid immersion unit 132 and supplying a predetermined amount of liquid Lq from liquid supply nozzle 131A as well as recovering a predetermined amount of liquid Lq from liquid recovery nozzle 131B.

Further, main controller 50 controls controller 80 and supplies liquid Lq whose specific resistance is reduced from liquid supply nozzle 131A of liquid immersion unit 132. Main controller 50 decides the supply amount of liquid Lq that is to be supplied from liquid supply nozzle 131A in order to continue filling the space of the optical path on the image plane side of projection optical system PL based on the film property (such as the contact angle with liquid Lq) of the surface of wafer W and various conditions such as the scanning velocity of wafer W during exposure, and inputs command values of the supply amount that has been decided into controller 80. Controller 80 controls flow control electromagnetic valve 86A so that the amount of liquid Lq corresponding to the command values of the supply amount from main controller 50 is supplied from liquid supply nozzle 131A, and also controls flow control electromagnetic valve 86B while monitoring specific resistance indicator 76 so that the specific resistance value of liquid Lq supplied from liquid supply nozzle 131A reaches a predetermined specific resistance value. In the embodiment, the specific resistance value of liquid Lq is adjusted to 10 [MΩ·cm] or under, preferably from 0.1 to 1.0·[MΩ·cm].

In the embodiment, because carbon dioxide ($CO_2$) is incorporated into and is dissolved in the pure water, depending on the amount of the carbon dioxide dissolved, the refractive index to illumination light IL may differ with the pure water that does not incorporate carbon dioxide, and there may be a case where the difference in the refractive index cannot be ignored. In such a case, the incorporation ratio of carbon dioxide to the pure water is a known desired value, and the refractive index of the liquid after the incorporation can be measured in advance. For example, the relation between the incorporation ratio of carbon dioxide to the pure water and the refractive index of the liquid after the incorporation can be stored in main controller 50, and based on the stored information, main controller 50 can control at least a part of projection optical system PL via image forming characteristics correction controller 52 taking into consideration the refractive index of the liquid (pure water) due to the dissolution of carbon dioxide (a predetermined substance). In such a case, the pattern of reticle R can be transferred onto wafer W via projection optical system PL and liquid Lq with good precision without being affected by the change in the refractive index of the liquid.

Further, in the case of incorporating and dissolving carbon dioxide in the pure water, depending on the amount of the carbon dioxide dissolved, the transmittance to illumination light IL (or a light having the same wavelength as the exposure light) may differ with the pure water that does not incorporate carbon dioxide, and there may be a case where the difference in the transmittance cannot be ignored. In this case, by performing a predetermined calculation based on results when illumination light IL is received by illuminance monitor 122 in a state where carbon dioxide is not incorporated and when illumination light IL is received by illuminance monitor 122 in a state after the carbon dioxide is incorporated, the transmittance change of the pure water (liquid) to illumination light IL (or the light having the same wavelength as the exposure light) due to the dissolution of carbon dioxide (a predetermined substance) can be obtained. Accordingly, main controller 50 can perform dose control (control of the integrated exposure amount) to wafer W on scanning exposure, taking into consideration the transmittance change. For example, main controller 50 performs dose control by switching the rough energy adjuster provided in illumination system ILS, by adjusting the pulsed energy or oscillation frequency (repetition frequency) of illumination light IL emitted from the light source, or by controlling the scanning velocity of reticle stage RST and wafer stage WST or the like. In such a case, the pattern of reticle R can be transferred onto wafer W via projection optical system PL and liquid Lq with good precision without being affected by the change in the transmittance of the liquid to illumination light IL (or the light having the same wavelength as the exposure light).

As is described above, according to exposure apparatus 100 of the embodiment, liquid immersion unit 132 has a mechanism of incorporating (dissolving) carbon dioxide that reduces specific resistance of liquid Lq, which is supplied in order to form an liquid immersion area on a film (a liquid repellent film, or a film formed by a resist (a resist film), or a top coat layer which is formed so as to cover the resist) on a member arranged on the light emitting side of tip lens 191, that is, on a part of measurement table MTB (a part of at least one of plate member 101 and each of the measuring instruments), or a part of wafer table WTB (a part of at least one of plate 93 and wafer W). Therefore, charging of liquid Lq can be prevented or effectively suppressed, and generation of dielectric breakdown of the film on which the liquid immersion area is formed can be effectively suppressed.

More specifically, for example, in the case of measuring illuminance, illuminance monitor 122 (optical sensor 128) receives illumination light IL via liquid repellent film WRF and liquid Lq on liquid repellent film WRF, and illuminance measurement of illumination light IL is performed. On such illuminance measurement, if an liquid immersion area of liquid Lq that is charged is formed on liquid repellent film WRF, a discharge (dielectric breakdown) may occur between light attenuating film 129 (a metal membrane) and liquid Lq via liquid repellent film WRF and there may be a possibility of damage occurring in liquid repellent film WRF. Further, by being in contact with liquid Lq that is charged, the vicinity of the contact surface to the liquid of liquid repellent film WRF could be charged, and a discharge (dielectric breakdown) may occur between light attenuating film 129 (a metal membrane) provided under liquid repellent film WRF and liquid repellent film WRF, which may cause damage in liquid repellent film WRF. When liquid repellent film WRF is damaged (deteriorated), the optical properties of liquid repellent film WRF may become uneven or the liquid repellency may be reduced, and thus water stains (water marks) may be generated.

However, in the embodiment, because carbon dioxide (carbonic acid gas) is dissolved in the pure water and liquid Lq whose specific resistance is reduced is supplied from liquid supply nozzle 131A, charging of liquid Lq can be prevented, which can effectively suppress the damage of liquid repellent film WRF due to dielectric breakdown. Accordingly, illuminance measurement using illuminance monitor 122 can be executed with high precision for over a long period of time, and by performing exposure of wafer W reflecting the measurement results, it becomes possible to perform exposure with high precision for over a long period of time.

In the description above, the case has been described referring to illuminance monitor 122, however, by suppressing the charging of liquid Lq, damage of the liquid repellent film on the upper surface of measurement stage MST can be prevented. Further, by suppressing the charging of liquid Lq, damage (deterioration) can be suppressed not only of the liquid repellent film on the upper surface of measurement stage MST, but also of the liquid repellent film on the upper surface of plate 93 of wafer stage WST.

Further, according to exposure apparatus 100 of the embodiment, scanning exposure for transferring the circuit pattern of reticle R onto wafer W is performed by illuminating reticle R by illumination light IL and synchronously moving reticle R and wafer W with respect to illumination light IL, via projection optical system PL and liquid Lq. On this scanning exposure, if an liquid immersion area of liquid Lq that is charged is formed on the resist film (or the top coat film) on the surface of wafer W, a discharge (dielectric breakdown) may occur between liquid Lq and the base material of wafer W (such as silicon) via the resist film (or via the top coat film and the resist film) and there may be a possibility of damage or modification occurring in the resist film (or the top coat film and the resist film). Further, by being in contact with liquid Lq that is charged, the vicinity of the contact surface to the liquid of the resist film (or the top coat film) could be charged, and a discharge (dielectric breakdown) may occur between the resist film (or the top coat film) and the base material of wafer W (such as silicon), which may cause damage or modification in the resist film (or the top coat film). When the resist film (or the top coat film) is damaged, liquid Lq may seep or infiltrate in from the damaged section and a defect may occur in the pattern formed on wafer W. Further, when the resist film (or the top coat film) is damaged or modified, a change may occur in reaction characteristics of illumination light IL to irradiation, which may prevent the desired pattern from being formed on wafer W.

However, in the embodiment, because carbon dioxide (carbonic acid gas) is dissolved in the pure water and liquid Lq whose specific resistance value is reduced is supplied from liquid supply nozzle 131A, the dielectric breakdown of the resist film (in the case a top coat layer is formed on the resist film, the resist film and top coat layer) on wafer W is effectively suppressed.

Further, in exposure apparatus 100 of the embodiment, by performing exposure with high resolution and a larger depth of focus than in the air by means of the liquid immersion exposure, the pattern of reticle R can be transferred with good precision on the wafer, and for example, transfer of a fine pattern that has a device rule of around 45 to 100 nm can be achieved using the ArF excimer laser beam.

In the embodiment above, liquid which is pure water that has carbon dioxide dissolved (carbonated water) is used as liquid Lq used for liquid immersion, however, it is a matter of course that the present invention is not limited to this. For example, if there are no adverse effects on the devices formed on wafer W, chlorine can be dissolved in the pure water in order to prevent liquid Lq from being charged.

Further, also in the case of using liquid other than the pure water, in order to prevent deterioration of the film on the object which occurs due to the charging of the liquid by adjusting the specific resistance of the liquid, it is preferable to use a liquid in which a predetermined substance that can adjust the specific resistance of the liquid is incorporated and dissolved.

In the embodiment above, the case has been described where incorporation of the predetermined substance (carbon dioxide) into the liquid (pure water) is performed on the upstream side of liquid temperature adjustment unit 72, however, the present invention is not limited to this, and the predetermined substance can also be incorporated into and dissolved between the liquid adjustment mechanism, which performs at least one of temperature adjustment and liquid flow control of the liquid, and the liquid supply nozzle.

For example, in the case there is a concern of microorganisms in liquid Lq multiplying, the incorporation of carbon dioxide (carbonic acid gas) is preferably performed at a position as close as possible to the image plane of projection optical system PL, such as at, for example, a position immediately before supply nozzle 131A or within supply nozzle 131A, so that the carbonic acid does not become a nutrient source for microorganisms.

Further, at least a part of a member that forms the supply flow passage of liquid Lq can be made of a material that releases carbon dioxide (carbonic acid gas) into liquid Lq without using $CO_2$ dissolving tank 82, or in combination with $CO_2$ dissolving tank 82.

Regardless of adjustment in the specific resistance value of liquid Lq, in the case of forming an liquid immersion area, by the friction between liquid Lq and wafer W (including at least one of the top coat layer and the resist film), the friction between liquid Lq and an object (such as plate 93 (including the liquid repellent film), plate member 101 (including the liquid repellent film), pattern plate 103 (including the liquid repellent film), slit plate 105 (including the liquid repellent film), pattern plate (including the liquid repellent film), or fiducial mark plate FM (including the liquid repellent film)), the friction between liquid Lq and nozzle members (such as 131A and 131B) or the like, a possibility occurs of at least one of liquid Lq, wafer W, the objects described above, and the nozzle members being charged. Therefore, it is preferable to have at least one of wafer W, the objects described above, and the nozzle member connected to the ground (earthed). By this arrangement, the charge of liquid Lq can be removed even when liquid Lq becomes charged. Further, adherence of foreign substances such as particles on the object, due to the charge of the objects described above or the charge of the nozzle member, can be prevented, and thus contamination of liquid Lq and wafer W due to the foreign substances can be prevented. As a matter of course, deterioration of at least one of the top coat layer and the resist film formed on wafer W, and the liquid repellent film on the objects described above can also be prevented.

Further, as is disclosed in the pamphlet of International Publication WO2005/031824 and the like, the charge of liquid Lq supplied to the space on the image plane side of projection optical system PL can be removed. In this case, liquid Lq supplied to the space on the image plane side of projection optical system PL can be kept from being charged more certainly.

Further, in the vicinity of the space on the image plane side of projection optical system PL, a neutralization apparatus (ionizer) as the one disclosed in Kokai (Japanese Patent Unexamined Application Publication) No. 2003-332218 or the like can be arranged, and at least one of liquid Lq, wafer W, the objects, and the nozzle member can be neutralized by supplying ions (negative ions) to the space on the image plane side of projection optical system PL (the periphery of liquid Lq). In this case, even if at least one of liquid Lq, wafer W, the objects, and the nozzle member is charged, the neutralization apparatus removes the electricity. Therefore, it is possible to prevent liquid Lq, wafer W, the object described above and the nozzle member, and the like from attracting contaminants such as particles, and thus contamination of liquid Lq and/or wafer W can also be prevented. Further, by blowing gas that has a neutralization function (e.g. gas that contains ions) in the vicinity of a surface interface of an liquid immersion area formed locally by liquid Lq, the gas can have not only the neutralization function but also a leakage prevention function of the liquid that forms the liquid immersion area. In the case exposure apparatus 100 has a gas seal mechanism installed for preventing leaking of the liquid forming the liquid immersion area as is disclosed in, for example, Kokai (Japanese Unexamined Patent Application Publication) No. 2004-289126 and the corresponding U.S. Patent Application Publication No. 2006/0023189, the gas used in the gas seal mechanism can contain the ions.

Further, regardless of adjustment in the specific resistance value of liquid Lq, in the case an liquid immersion area is formed on wafer W, wafer W (including at least one of the resist film and the top coat film) may be charged due to the friction between liquid Lq and wafer W. Because wafer W in a charged state attracts foreign substances such as particles, wafer W may be contaminated.

Therefore, the resist film (or the top coat film) of the surface of wafer W can be formed of a conductive substance so as to prevent the charging of wafer W (including at least one of the resist film and the top coat film). Or, the wafer holder that holds wafer W can be made of a conductive material, or a contact member made of a conductive material that comes into contact with wafer W held on the wafer holder can be arranged, so as to prevent the charging of wafer W (including at least one of the resist film and the top coat film).

Further, the liquid repellent film formed on plate member 93 or the like can be conductive.

Further, in the case there is a possibility of wafer W (including at least one of the resist film and the top coat film) being carried out in a charged state, at least one of a carriage member or transport member that carries wafer W before exposure or after exposure can be made of a conductive material so as to release (remove) the electrical charge of wafer W. Or, in order to remove the electricity of at least one of wafer W carried onto wafer stage WST and wafer W carried from wafer stage WST, a unit for soaking (e.g. cleaning) wafer W with a conductive liquid (pure water that has carbon dioxide dissolved) can be arranged on the carrier path or transport path of wafer W. Or a neutralization apparatus such as an ionizer can be arranged along the carrier path of wafer W. In the case a liquid removal unit that removes, for example, drops of liquid Lq remaining (adhering) on wafer W after exposure is installed in exposure apparatus 100, it is preferable to perform not only liquid removal but also charge removal within the liquid removal unit. Further, in the case a temperature adjustment unit for performing temperature control of wafer W before wafer W is carried onto wafer stage WST is arranged in exposure apparatus 100, charge removal can be performed in the temperature adjustment unit.

Further, in order to neutralize wafer W, a unit for soaking (e.g. cleaning) wafer W with a conductive liquid (pure water that has carbon dioxide dissolved) or a neutralization apparatus such as an ionizer can be arranged within a substrate processing unit (including at least one of a coating unit that carries out pre-exposure wafer W to exposure apparatus 100 and a development unit into which wafer W that has been exposed by exposure apparatus 100 is carried) that is connected to exposure apparatus 100. Or, in the development unit to which wafer W that has been exposed in exposure apparatus 100 is carried, a conductive rinsing liquid can be used when performing development of post-exposure wafer W. In the case an interface section is arranged between exposure apparatus 100 and the substrate processing unit, the neutralization process of removing the charge from wafer W can be performed in the interface section.

Further, in the embodiment above, the case has been described where the exposure apparatus is provided with measurement stage MST separately from wafer stage WST. However, the measurement stage does not necessarily have to be arranged, and the various measuring instruments such as illuminance monitor 122 including glass member 126 can be arranged on an object stage (wafer stage WST) on which the object is mounted. Even in such a case, measurement with high precision can be executed for over a long period of time by the aid of illuminance monitor 122 and the like, and by performing exposure of wafer W with the measurement results being reflected, it becomes possible to perform the exposure with high precision for over a long period of time.

In the embodiment above, the case has been described where the present invention is applied to a scanning exposure apparatus of the step-and-scan method, however, the scope of the invention is naturally not limited to this. More specifically, the present invention can also be applied to a projection exposure apparatus by the step-and-repeat method, and furthermore to an exposure apparatus by the step-and-stitch method, an exposure apparatus by the proximity method and the like.

Further, the present invention can also be applied to a multi-stage type exposure apparatus that has a plurality of wafer stages for holding the wafer, as is disclosed in Kokai (Japanese Unexamined Patent Publication) No. 10-163099, Kokai (Japanese Unexamined Patent Publication) No. 10-214783 and the corresponding U.S. Pat. No. 6,341,007, and in Kohyo (Japanese Unexamined Patent Publication) No. 2000-505958 and the corresponding U.S. Pat. No. 5,969,441 and the like. As long as the national laws in designated states or elected states, to which this international application is applied, permit, the disclosures of each of the publications and the corresponding U.S. patents cited above are fully incorporated herein by reference.

Further, the exposure apparatus to which the liquid immersion method described above is applied employs the configuration where wafer W is exposed while the optical path space on the light-emitting side of the end optical element of projection optical system PL is filled with liquid (pure water). However, as is disclosed in the pamphlet of International Publication WO2004/019128 and the corresponding U.S. Patent Application Publication No. 2005/0248856 and the like, the optical path space on the light-incident side of the end optical element of projection optical system PL can also be filled with liquid (pure water). As long as the national laws in designated states or elected states, to which this international application is applied, permit, the above disclosures of the Kokai publication and the U.S. patent application publication are incorporated herein by reference.

Further, in the embodiment above, the exposure apparatus in which liquid is locally filled in the space between projection optical system PL and wafer W is employed, however, the present invention can also be applied to an liquid immersion exposure apparatus that performs exposure in a state where the entire surface of the wafer subject to exposure is soaked in the liquid as is disclosed in, Kokai (Japanese Unexamined Patent Publication) No. 6-124873, Kokai (Japanese Unexamined Patent Publication) No. 10-303114, and in U.S. Pat. No. 5,825,043 and the like.

In the embodiment above, a transmittance type mask is used, which is a transmissive mask on which a predetermined light shielding pattern (or a phase pattern or a light-reducing pattern) is formed. Instead of this mask, however, as is disclosed in, for example, U.S. Pat. No. 6,778,257, an electron mask on which a light-transmitting pattern, a reflection pattern, or an emission pattern is formed according to electronic data of the pattern that is to be exposed can also be used.

Further, as is disclosed in the pamphlet of International Publication WO2001/035168, by forming interference fringes on wafer W, the present invention can also be applied to an exposure apparatus (lithography system) that forms line-and-space patterns on wafer W.

The present invention is not limited to the exposure apparatus for manufacturing semiconductors, and it can also be widely applied to an exposure apparatus used for manufacturing liquid crystal displays that transfers a liquid crystal display device pattern onto a glass plate, an exposure apparatus used for manufacturing organic ELs, thin film magnetic heads, imaging devices (such as CCDs), micromachines, DNA chips, and the like. Further, the present invention can also be applied to an exposure apparatus that transfers a circuit pattern onto a glass substrate or a silicon wafer not only when producing microdevices such as semiconductors, but also when producing a reticle or a mask used in exposure apparatus such as an optical exposure apparatus, an EUV exposure apparatus, an X-ray exposure apparatus, and an electron beam exposure apparatus.

The light source of the exposure apparatus in the embodiment above is not limited to the ArF excimer laser, and it is also possible to use a pulsed laser light source such as the KrF excimer laser (output wavelength 248 nm), the $F_2$ laser (output wavelength 157 nm), the $Ar_2$ laser (output wavelength 126 nm), the $Kr_2$ laser (output wavelength 146 nm), or the like, or an ultra high-pressure mercury lamp that emits bright lines such as the g-line (wavelength 436 nm) or the i-line (wavelength 365 nm). Further, a harmonic generation unit of a YAG laser can also be used. Besides such units, a harmonic may also be used that is obtained by amplifying a single-wavelength laser beam in the infrared or visible range emitted by a DFB semiconductor laser or fiber laser, with a fiber amplifier doped with, for example, erbium (or both erbium and ytterbium), and by converting the wavelength into ultraviolet light using a nonlinear optical crystal. Further, the projection optical system is not limited to a reduction system, and the system may also be a system of equal magnification or a magnifying system.

Semiconductor devices are manufactured through the following steps: a step where the function/performance design of a device is performed; a step where a reticle based on the design step is manufactured; a step where a wafer is manufactured using silicon materials; a lithography step where the pattern formed on the reticle is transferred onto an object such as a wafer by the liquid immersion exposure previously described using the exposure apparatus in the embodiment above; a device assembly step (including processes such as dicing process, bonding process, and packaging process); inspection step, and the like. In this case, in the lithography step, because the device pattern is formed on the object executing the liquid immersion exposure method previously described using the exposure apparatus in the embodiment above, high integration devices can be manufactured with good yield.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An exposure apparatus comprising:
   a projection system;
   a liquid immersion system that has a gas dissolving apparatus in which a gas is dissolved in liquid, the gas dissolved liquid being supplied to a space under the projection system; and
   a sensor system that has an optical member to be placed below the projection system and has a sensor which receives a light from the projection system through the gas dissolved liquid in the space via the optical member;
   wherein:
   the liquid immersion system has a liquid temperature adjusting apparatus disposed downstream of the gas dissolving apparatus, by which a temperature of the gas dissolved liquid is adjusted,
   a liquid immersion area of the gas dissolved liquid is formed on only a portion of an upper surface of a substrate, and
   the substrate is exposed with an exposure beam through the gas dissolved liquid.

2. The exposure apparatus according to claim 1, wherein the gas is capable of changing specific resistance of the liquid supplied to the gas dissolving apparatus.

3. The exposure apparatus according to claim 1, wherein the gas is carbon dioxide gas.

4. The exposure apparatus according to claim 1, wherein the gas contains carbon dioxide.

5. The exposure apparatus according to claim 1, further comprising:
   a resistivity meter disposed downstream of the gas dissolving apparatus.

6. The exposure apparatus according to claim 1, wherein the sensor is fixed on a lower surface of the optical member.

7. The exposure apparatus according to claim 1, wherein
   a gas, which has a function to remove electrical charge of the liquid, is blown in the vicinity of a gas-liquid interface of the liquid immersion area.

8. The exposure apparatus according to claim 1, further comprising:
   a stage having a holder on which the substrate is held, wherein
   the holder is formed by a conductive material.

9. The exposure apparatus according to claim 1, further comprising:
   a nozzle member having a supply opening from which the gas dissolved liquid is supplied to the space, wherein
   the nozzle member is grounded.

10. A device manufacturing method comprising:
    exposing a substrate by using the exposure apparatus according to claim 1, and
    processing the substrate that has been exposed.

11. An exposure method comprising:
    supplying, with a gas dissolving apparatus of a liquid immersion system, gas dissolved liquid to a space under a projection system; and
    receiving, using a sensor of a sensor system that has an optical member to be placed below the projection system, a light from the projection system through the gas dissolved liquid in the space via the optical member;
    wherein:
    the liquid immersion system has a liquid temperature adjusting apparatus disposed downstream of the gas dissolving apparatus, by which a temperature of the gas dissolved liquid is adjusted,
    a liquid immersion area of the gas dissolved liquid is formed on only a portion of an upper surface of a substrate, and
    the substrate is exposed with an exposure beam through the gas dissolved liquid.

12. The exposure method according to claim 11, wherein the gas is capable of changing specific resistance of the liquid supplied to the gas dissolving apparatus.

13. The exposure method according to claim 11, wherein the gas is carbon dioxide gas.

14. The exposure method according to claim 11, wherein the gas contains carbon dioxide.

15. The exposure method according to claim 11, further comprising:
    disposing a resistivity meter downstream of the gas dissolving apparatus.

16. The exposure method according to claim 11, wherein the sensor is fixed on a lower surface of the optical member.

17. The exposure method according to claim 11, wherein
    a gas, which has a function to remove electrical charge of the liquid, is blown in the vicinity of a gas-liquid interface of the liquid immersion area.

18. The exposure method according to claim 11, further comprising:
    holding the substrate on a stage via a holder, wherein the holder is formed by a conductive material.

19. The exposure method according to claim 11, further comprising:
supplying the gas dissolved liquid to the space via a supply opening of a nozzle member, wherein the nozzle member is grounded.

20. A device manufacturing method comprising:
exposing a substrate by using the exposure method according to claim 11; and
processing the substrate that has been exposed.

* * * * *

UNITED STATES PATENT AND TRADEMARK OFFICE
CERTIFICATE OF CORRECTION

PATENT NO. : 9,618,854 B2  
APPLICATION NO. : 15/145561  
DATED : April 11, 2017  
INVENTOR(S) : Kenichi Shiraishi et al.

Page 1 of 1

It is certified that error appears in the above-identified patent and that said Letters Patent is hereby corrected as shown below:

On the Title Page

Item (56), on page 2, Column 2, Other Publications section, please delete:

"Apr. 8, 2016 Notice of Allowance issued in U.S. Appl. No. 13/317,169."

Signed and Sealed this  
Eighteenth Day of July, 2017

Joseph Matal  
*Performing the Functions and Duties of the*  
*Under Secretary of Commerce for Intellectual Property and*  
*Director of the United States Patent and Trademark Office*